US009809880B2

(12) United States Patent
Jang et al.

(10) Patent No.: US 9,809,880 B2
(45) Date of Patent: Nov. 7, 2017

(54) ATOMIC LAYER DEPOSITION APPARATUS

(71) Applicant: Samsung Display Co. Ltd., Yongin, Gyeonggi-Do (KR)

(72) Inventors: Choel Min Jang, Seoul (KR); In Kyo Kim, Seongnam-si (KR); Suk Won Jung, Seoul (KR); Myung Soo Huh, Suwon-si (KR)

(73) Assignee: SAMSUNG DISPLAY CO. LTD., Gyeonggi-Do (KR)

( * ) Notice: Subject to any disclaimer, the term of this patent is extended or adjusted under 35 U.S.C. 154(b) by 0 days.

(21) Appl. No.: 14/444,231

(22) Filed: Jul. 28, 2014

(65) Prior Publication Data
US 2015/0259798 A1 Sep. 17, 2015

(30) Foreign Application Priority Data

Mar. 17, 2014 (KR) ........................ 10-2014-0031009

(51) Int. Cl.
C23C 16/00 (2006.01)
C23C 16/44 (2006.01)
C23C 16/455 (2006.01)
C23C 16/54 (2006.01)

(52) U.S. Cl.
CPC .. *C23C 16/45546* (2013.01); *C23C 16/45502* (2013.01); *C23C 16/45527* (2013.01); *C23C 16/45548* (2013.01); *C23C 16/45578* (2013.01); *C23C 16/545* (2013.01)

(58) Field of Classification Search
CPC ........ C23C 16/45544–16/45548; C23C 16/63; C23C 16/74; C23C 16/78

USPC .................. 118/715, 719, 728, 723 R, 50
See application file for complete search history.

(56) References Cited

U.S. PATENT DOCUMENTS

| 6,086,677 A * | 7/2000 | Umotoy ........... C23C 16/45514 118/715 |
| 2004/0231799 A1 | 11/2004 | Lee et al. |
| 2008/0110399 A1* | 5/2008 | Park ................. C23C 16/45504 118/715 |
| 2009/0078204 A1 | 3/2009 | Kerr et al. |
| 2009/0095222 A1* | 4/2009 | Tam ................. C23C 16/45565 118/723 R |
| 2009/0291211 A1* | 11/2009 | Ryu ................. C23C 16/45551 427/255.23 |
| 2011/0048325 A1* | 3/2011 | Choi .................... C23C 16/452 118/712 |

(Continued)

FOREIGN PATENT DOCUMENTS

| JP | 2007-317704 | 12/2007 |
| KR | 10-0407507 | 11/2003 |

(Continued)

*Primary Examiner* — Yewebdar Tadesse
(74) *Attorney, Agent, or Firm* — Cantor Colburn LLP

(57) ABSTRACT

An atomic layer deposition apparatus includes a first base plate on which a seat portion is defined to allow a substrate to be seated thereon, a second base plate disposed opposite to the first base plate, a first gas nozzle portion arranged on the second base plate, a second gas nozzle portion arranged on the second base plate to be spaced apart from the first gas nozzle portion and substantially parallel to the first gas nozzle portion, and a gas storage portion connected to the first gas nozzle portion and the second gas nozzle portion.

17 Claims, 19 Drawing Sheets

(56) References Cited

U.S. PATENT DOCUMENTS

2011/0293854 A1* 12/2011 Takizawa .......... H01J 37/32935
                                                  427/569
2011/0308460 A1    12/2011 Hong et al.
2015/0194604 A1*   7/2015 Jang .................. C23C 16/45574
                                                  438/28

FOREIGN PATENT DOCUMENTS

| KR | 10-0631305      | 9/2006  |
| KR | 1020090031496 A | 3/2009  |
| KR | 10-1097737      | 12/2011 |

* cited by examiner

ATOMIC LAYER DEPOSITION APPARATUS

This application claims priority to Korean Patent Application No. 10-2014-0031009, filed on Mar. 17, 2014, and all the benefits accruing therefrom under 35 U.S.C. §119, the content of which in its entirety is herein incorporated by reference.

BACKGROUND

1. Field

Exemplary embodiments of the invention relate to an atomic layer deposition apparatus, and more particularly to an atomic layer deposition apparatus which forms an atomic layer in the form of a fine thin film on a substrate.

2. Description of the Prior Art

A gas injection device of an atomic layer deposition apparatus typically includes injection nozzles for injecting multiple reaction gases and purge gas nozzles provided between the injection nozzles to prevent foreign substances from being generated due to unwanted reactions between the reaction gases.

In general, to deposit a thin film having a predetermined thickness on a substrate, such as a semiconductor wafer or glass, a thin film fabrication method using a steam method, a chemical vapor deposition method, or an atomic layer deposition method is used. Among such deposition methods, the atomic layer deposition method is a method for stacking respective reactants on a processed substrate in the unit of an atomic layer by successively supplying reaction gases and purge gases through a gas pulsing method.

The atomic layer deposition method is typically used to form a thin film having a high aspect ratio to increase integrity of a semiconductor device, for thin film uniformity on uneven surfaces, and to improve electrical and physical properties. According to the atomic layer deposition method, reactants are dissolved by chemical replacements through a periodic supply of reaction gases rather than incineration to provide a stoichiometric film with high film density. Since residual products produced due to the chemical replacements in the process are always gases, the residual products may be efficiently removed to facilitate cleaning of a chamber. Further, since only temperature is a process parameter, the process adjustment and maintenance may be easily performed. However, it typically takes a relatively long time to form a desired thin film over the whole region of the substrate using the atomic layer deposition apparatus in comparison to other deposition apparatuses.

SUMMARY

Accordingly, exemplary embodiments of the invention relate to an atomic layer deposition apparatus which may shorten a processing time for a deposition.

According to an exemplary embodiment of the invention, an atomic layer deposition apparatus includes: a first base plate on which a seat portion is defined to allow a substrate to be seated thereon; a second base plate disposed opposite to the first base plate; a first gas nozzle portion arranged on the second base plate; a second gas nozzle portion arranged on the second base plate to be spaced apart from the first gas nozzle portion and substantially parallel to the first gas nozzle portion, and a gas storage portion connected to the first gas nozzle portion and the second gas nozzle portion.

According to another exemplary embodiment of the invention, an atomic layer deposition apparatus includes a chamber, a first base plate arranged inside the chamber and on which a seat portion is defined to allow a substrate to be seated thereon; a second base plate disposed opposite to the first base plate; a first gas nozzle portion arranged on the second base plate, a second gas nozzle portion arranged on the second base plate to be spaced apart from the first gas nozzle portion and substantially parallel to the first gas nozzle portion, and a gas storage portion connected to the first gas nozzle portion and the second gas nozzle portion.

According to exemplary embodiments of the invention, a plurality of gas nozzle portions for successively injecting different gases are used, such that processing time for forming a thin film on a substrate may be substantially reduced.

BRIEF DESCRIPTION OF THE DRAWINGS

The above and other features of the invention will be more apparent from the following detailed description taken in conjunction with the accompanying drawings, in which.

DETAILED DESCRIPTION

Figure 1:
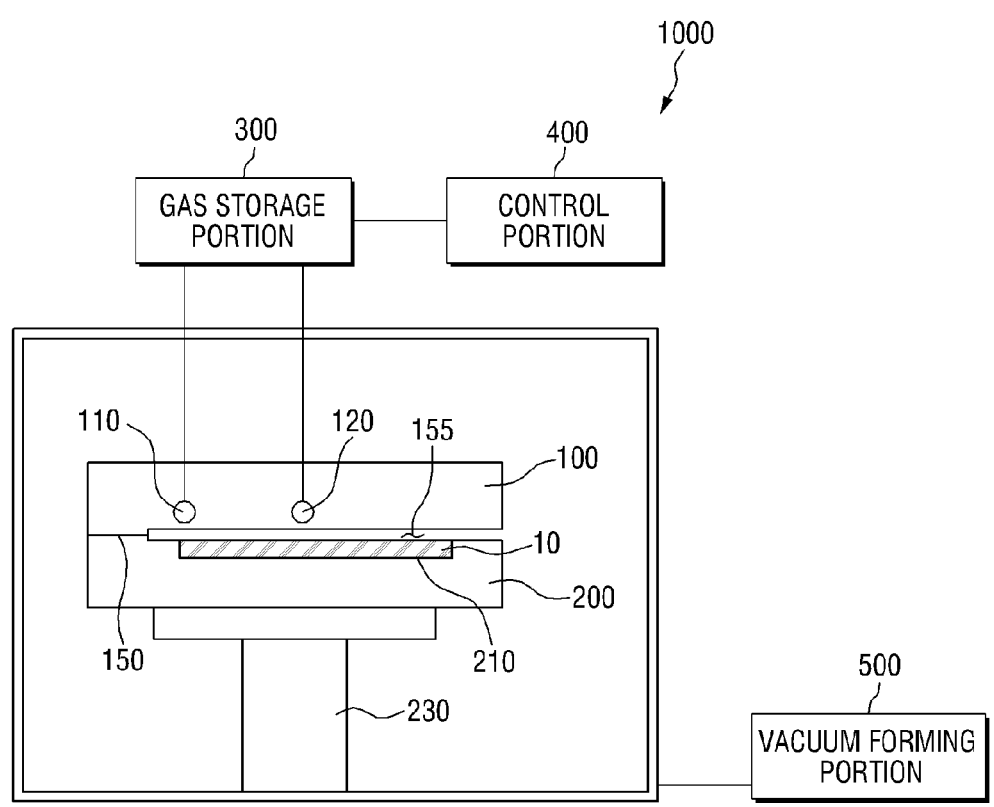
FIG. 1 is a cross-sectional view of an atomic layer deposition apparatus according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the invention will be described in detail with reference to the accompanying drawings.

Figure 2:
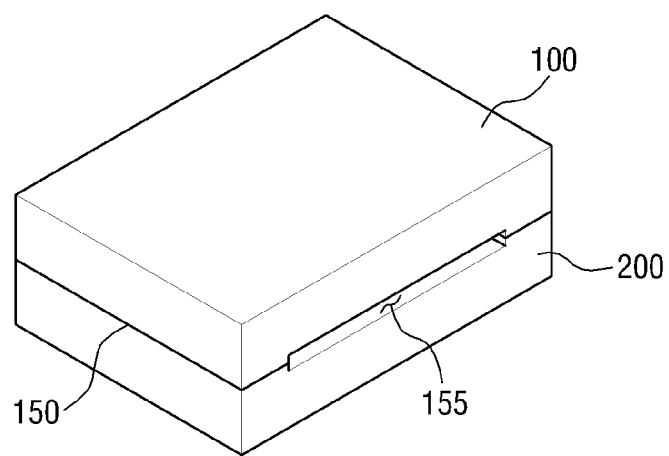
FIG. 2 is a partially enlarged view of the atomic layer deposition apparatus of FIG. 1.

FIG. 1 is a cross-sectional view of an exemplary embodiment of an atomic layer deposition apparatus according to the invention. FIG. 2 is a partially enlarged view of the atomic layer deposition apparatus of FIG. 1, and FIG. 3 is a partial plan view of the atomic layer deposition apparatus of FIG. 1.

Figure 3:
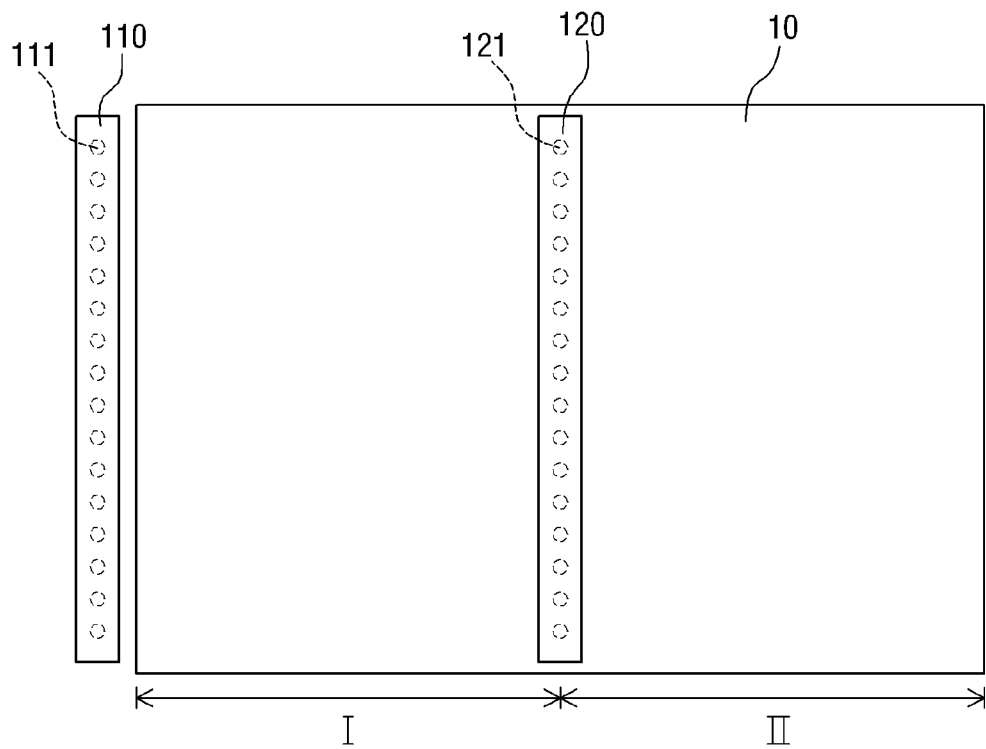
FIG. 3 is a partial plan view of the atomic layer deposition apparatus of FIG. 1.

Referring to FIGS. 1 to 3, an exemplary embodiment of an atomic layer deposition apparatus according to the invention includes a chamber, a first base plate 200 which is arranged inside the chamber and on which a substrate 10 is disposed, a second base plate 100 disposed opposite to the first base plate 200, e.g., arranged on the first base plate 200 to face the first base plate, a first gas nozzle portion 110 disposed on the second base plate 100 to extend substantially in a first direction, a second gas nozzle portion 120 arranged to be spaced apart from the first gas nozzle portion 110 and substantially parallel to the first gas nozzle portion 110, a gas storage portion 300 connected to the first gas nozzle portion 110 and the second gas nozzle portion 120, and a control portion 400 which controls gas injected from the first gas nozzle portion 110 and the second gas nozzle portion 120.

The chamber 600 may have a predetermined space defined therein. Several elements of the atomic layer deposition apparatus to be described later may be arranged in the space of the chamber 600. In an exemplary embodiment, for example, the chamber 600 may be in a cuboidal shape, but the shape of the chamber 600 is not limited thereto. In an exemplary embodiment, the inside and outside of the chamber 600 may be separated from each other. In such an embodiment, the inside of the chamber 600 may be isolated from the outside of the chamber 600. In an exemplary embodiment, the inside of the chamber 600 may be in a vacuum state, but not being limited thereto. In an alternative exemplary embodiment, the inside of the chamber 600 may be connected to the outside of the chamber 600. In an exemplary embodiment, the chamber 600 may be connected to a vacuum forming portion 500 to allow or maintain the inner space of the chamber 600 to be in a vacuum state. The vacuum forming portion 500 will be described later in greater detail.

The first base plate 200 may be arranged in the chamber 600. The first base plate 200 may support the substrate 10, and the substrate 10 may be disposed or seated on the first base plate 200.

In an exemplary embodiment, the first base plate 200 may be in a plane shape or in a rectangular shape, but is not limited thereto. In an alternative exemplary embodiment, the first base plate 200 may be in a circular shape or may include a curve portion.

The first base plate 200 may have a reference surface and a first recessed groove defined or formed to be recessed from the reference surface. In an exemplary embodiment in which the plane shape of the first base plate 200 is in a rectangular shape, the first recessed groove may be in a cuboidal shape having an opening. In such an embodiment, one side of the first recessed groove may be closed and the other side thereof may be opened. In such an embodiment, a side wall may be arranged along the circumference of the remaining portion of the first recessed groove except for a portion where the opening is defined. In an exemplary embodiment in which the first recessed groove is in a cuboidal shape, the reference surface of the first base plate 200 may be in a "⊏"-like shape.

Herein, the substrate 10 may be a display substrate for displaying an image, and may include a display panel 500, such as a liquid crystal display ("LCD") panel, an electrophoretic display panel, an organic light emitting diode ("OLED") panel, a light emitting diode ("LED") panel, an inorganic electroluminescent display ("EL") panel, a field emission display ("FED") panel, a surface-conduction electron-emitter display ("SED") panel, a plasma display panel ("PDP"), or a cathode ray tube ("CRT") display panel. In an exemplary embodiment, the panel may be a flexible display panel in which an indium tin oxide ("ITO") thin film is disposed as a transparent electrode. However, in another alternative exemplary embodiment, the substrate 10 is not limited to the types of substrate described herein. In an exemplary embodiment, the substrate 10 may be any substrate, on which a thin film for performing a specific function may be formed.

In an exemplary embodiment, the first base plate 200 may be supported by a driving portion 230. The driving portion 230 may move the first base plate 200 upward and downward. In such an embodiment, the driving portion may allow the first base plate 200 to be in contact with or be spaced apart from the second base plate 100. For convenience in illustration, FIG. 1 illustrates an exemplary embodiment, where the second base plate 100 is fixed and the first base plate 200 is movable. However, the invention is not limited thereto, and in an alternative exemplary embodiment, the first base plate 200 and the second base plate 100 may move toward or away from each other.

In an exemplary embodiment, a seat portion 210, on which the substrate 10 is seated, may be defined on the first recessed portion of the first base plate 200. The seat portion 210 is a portion of the first base plate 200 that fixes the substrate 10 thereon and may have a shape that corresponds to the shape of the substrate 10.

The second base plate 100 may be arranged on the first base plate 200. The second base plate 100 may be arranged on the first base plate 200 to face the first base plate 200. In an exemplary embodiment, a second recessed groove, which corresponds to the first recessed groove arranged on the first base plate 200, may be arranged on the second base plate 100. The second recessed groove may be defined to be recessed by a predetermined distance from a reference surface of the second base plate 100. The second recessed groove may have substantially the same shape as the first recessed groove arranged on the first base plate 200. In an exemplary embodiment, one side of the second recessed groove may be closed, and the other thereof may be opened. In an exemplary embodiment, the second recessed groove may be in a cuboidal shape having an opening.

In an exemplary embodiment, the reference surfaces of the first base plate 200 and the second base plate 100 may be disposed to be in contact with each other. In such an embodiment, when the reference surfaces of the first base plate 200 and the second base plate 100 is move to be in contact with each other, a predetermined space may be defined by the first recessed groove of the first base plate 200 and the second recessed groove of the second base plate 100. In such an embodiment, as shown in FIG. 2, an inner space that is in a cuboidal shape having one open side may be defined when the reference surfaces of the first base plate 200 and the second base plate 100 are in contact with each other. For convenience in description, such a space will be referred to as a reaction space 155. In an exemplary embodiment, the reaction space 155 has an opening defined toward the chamber 600, and the remaining portion of the reaction space 155 except for the opening is closed. In such an embodiment, a seal member may be arranged on a contact surface 150 between the first base plate 200 and the second base plate 100 to seal the remaining side surface except for the opening. In an exemplary embodiment, the seal member may include or be formed of an elastic material, and the remaining inner side wall of the reaction space 155 may be sealed so that the contact surface 150 between the first base plate 200 and the second base plate 100 is sealed, i.e., so that air is effected prevented from flowing through the remaining portion except for the one open side.

In an exemplary embodiment, the first gas nozzle portion 110 and the second gas nozzle portion 120 may be arranged on the second base plate 100.

In an exemplary embodiment, the first gas nozzle portion 110 may be arranged on one side of the second recessed groove of the second base plate 100, e.g., on an upper portion of the opposite side of the portion having the opening formed thereon. The first gas nozzle portion 110 may extend substantially in the first direction. The first direction may be a direction that is substantially parallel to a predetermined side of the inner space 155.

In an exemplary embodiment, as shown in FIG. 3, a plurality of injection holes 111 may be defined on the first gas nozzle portion 110. The injection holes may be aligned substantially in the first direction, and may be arranged to be spaced apart from each other at a predetermined distance. Various kinds of gases, which will be described later in greater detail, may be injected through the respective injection holes 111.

The second gas nozzle portion 120 may be arranged to be spaced apart from the first gas nozzle portion 110 at a predetermined distance. The second gas nozzle portion 120 may have substantially the same shape as the first gas nozzle portion 110. In an exemplary embodiment, the second gas nozzle portion 120 may extend substantially in the first direction and may include a plurality of injection holes 121 that are aligned along the first direction.

The second gas nozzle portion 120 may be spaced apart from the first gas nozzle portion 110 and may be arranged substantially parallel to the first gas nozzle portion 110. In an exemplary embodiment, the second gas nozzle portion 120 may be arranged in a center portion of the inner space. However, the position of the second gas nozzle portion 120 is not limited thereto.

In an exemplary embodiment in which the substrate 10 is seated on the first base plate 200, the first gas nozzle portion 110 may be arranged on an upper portion of one side (e.g., a first side) of the substrate 10, and the second gas nozzle portion 120 may be arranged on the center portion of the substrate 10.

In an exemplary embodiment, as shown in FIG. 3, a first region I and a second region II may be defined on the substrate 10 on the seat portion 210.

The first region I may be a region of the substrate 10 that is arranged between the first gas nozzle portion 110 and the second gas nozzle portion 120, and the second region II may be a region of the substrate 10 that is arranged between the second gas nozzle portion 120 and the other side (e.g., the second side) of the substrate 10. As illustrated in FIG. 3, the first and second regions I and II may be defined on the substrate 10 to correspond to the two gas nozzle portions. The first region I and the second region II may have substantially the same width, but are not limited thereto. In an exemplary embodiment, the first region I and the second region II may be any two divided regions of the substrate 10 having substantially the same area as each other.

The first region I may correspond to the first gas nozzle portion 110, and the second region II may correspond to the second gas nozzle portion 120. In such an embodiment, as described below, the first gas nozzle portion 110 may inject gas into the first region I to form an atomic layer, and the second gas nozzle portion 120 may inject gas into the second region II to form an atomic layer. The details thereof will be described later.

The first gas nozzle portion 110 and the second gas nozzle portion 120 may be connected to the gas storage portion 300.

This will be described in detail with reference to FIG. 4.

Figure 4:
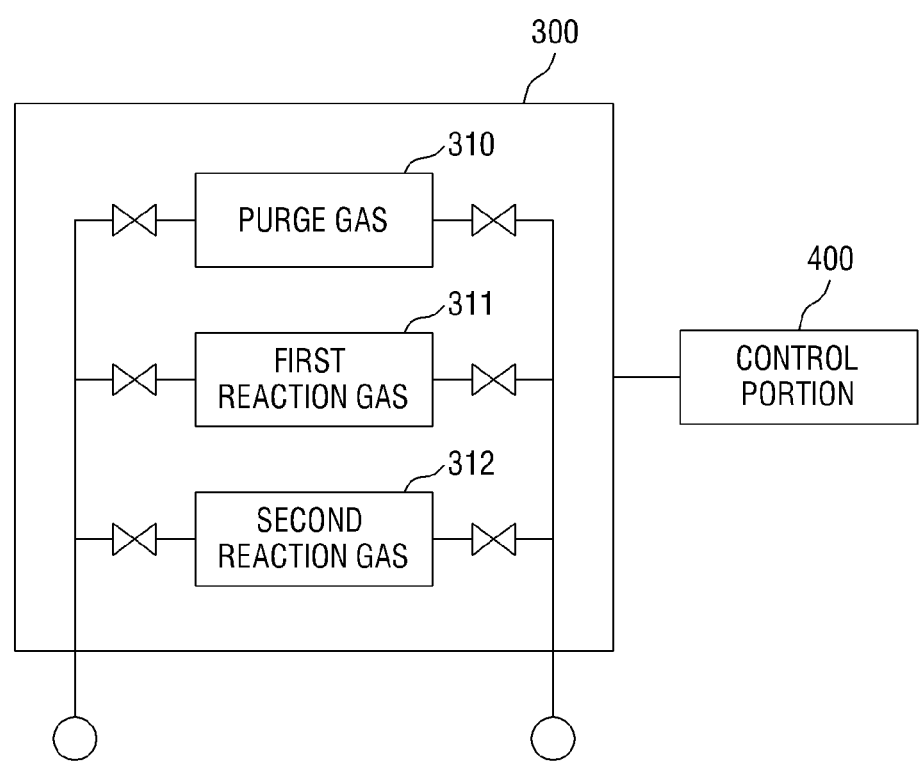
FIG. 4 is a block diagram illustrating the configuration of a gas storage portion of an exemplary embodiment of an atomic layer deposition apparatus according to the invention.

FIG. 4 is a block diagram illustrating the configuration of a gas storage portion 300 of an exemplary embodiment of an atomic layer deposition apparatus according to the invention.

Referring to FIG. 4, the gas storage portion 300 of an exemplary embodiment of an atomic layer deposition apparatus according to the invention may include a first reaction gas storage portion 311, a purge gas storage portion 310, and a second reaction gas storage portion 312.

FIG. 4 illustrates an exemplary embodiment in which both the first gas nozzle portion 110 and the second gas nozzle portion 120 are connected to the first reaction gas storage portion 311, the purge gas storage portion 310 and the second reaction gas storage portion 312, but the structure of the gas storage portion 300 and the connection structure thereof are not limited thereto. In an alternative exemplary embodiment, the first gas nozzle portion 110 and the second gas nozzle portion 120 may be connected to separate first reaction gas storage portions 310, separate purge gas storage portions 310 or separate second reaction gas storage portions 312, respectively.

In an exemplary embodiment, the first reaction gas may be trimenthulaluminium ("TMA"), and the second reaction gas may be $HO_x$, plasma $O_2$, $O_3$ or a combination thereof. In such an embodiment, the purge gas may be an inert gas, such as nitrogen or argon gas, for example. However, the invention is not limited thereto, and in an alternative exemplary embodiment, various kinds of the first reaction gas, the second reaction gas and the purge gas may be used.

The first gas nozzle portion 110, the second gas nozzle portion 120 and the gas storage portion 300 may be controlled by the control portion 400. In an exemplary embodiment, the control portion 400 may allow one of the first reaction gas, the second reaction gas and the purge gas to be selected and to be selectively injected through the first gas nozzle portion 110 and/or the second gas nozzle portion 120 for a predetermined time period.

In an exemplary embodiment, the control portion 400 may control the kinds of gases that are injected through valves connected to the respective gas storage portions 300, but the control method is not limited thereto.

Hereinafter, the operation of an exemplary embodiment of an atomic layer deposition apparatus according to the invention will be described in detail with reference to FIGS. 5 to 11.

Figure 5:
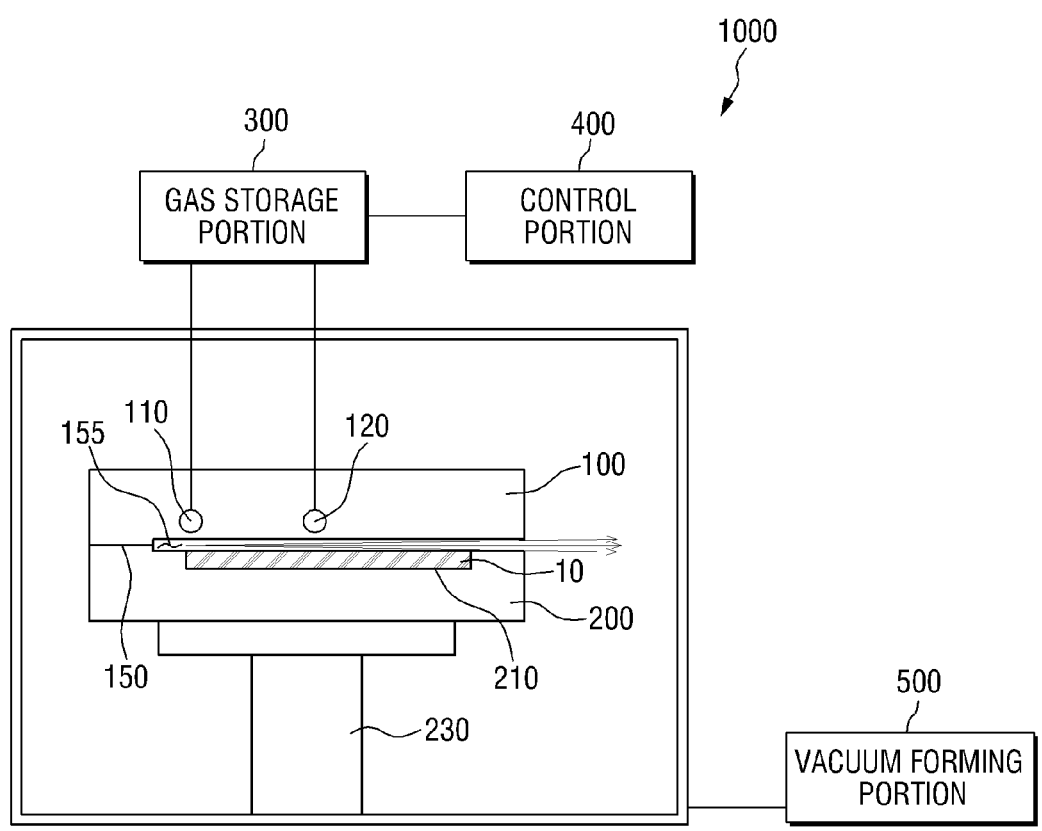
FIG. 5 is a cross-sectional view of an exemplary embodiment of an atomic layer deposition apparatus according to the invention.

FIG. 5 is a cross-sectional view of an exemplary embodiment of an atomic layer deposition apparatus according to the invention.

Referring to FIG. 5, an inner space of the chamber 600 of an exemplary embodiment of the atomic layer deposition apparatus according to the invention is in a vacuum state.

As described above, vacuum may be formed in the inner space of the chamber 600. The vacuum state of the inner space of the chamber 600 may be provided by the vacuum forming portion 500 connected to the chamber 600. In an exemplary embodiment, the vacuum forming portion 500 may form the vacuum using a vacuum forming pump, but not being limited thereto.

In an exemplary embodiment, when gas is injected from the first gas nozzle portion 110 and/or the second gas nozzle portion 120 to the inner space of the chamber 600 in the vacuum state, the injected gas may travel in a second direction that is substantially perpendicular to the first directions, such that the injected gas may travel toward the opening of the reaction space 155 between the first base plate 200 and the second base plate 100.

Herein, for convenience of description, a unit time may be defined as a time taken for one gas nozzle portion to constantly inject one gas. That is, for one unit time s, one kind of gas may be constantly injected from one gas nozzle portion. Further, one unit time may be a time taken for one gas nozzle portion to form an atomic layer on a region that corresponds to one gas nozzle portion. That is, in an exemplary embodiment in which the first region I and the second region II are defined on the substrate 10 and the atomic layer deposition apparatus includes the first gas nozzle portion 110 and the second gas nozzle portion 120, one unit time may be defined as a time taken for the first gas nozzle portion 110 to form an atomic layer on the first region I.

In an exemplary embodiment of the atomic layer deposition apparatus according to the invention, different gases may be injected from the first gas nozzle portion 110 and the second gas nozzle portion 120 for one unit time.

In one exemplary embodiment, for example, a first reaction gas may be injected from the first gas nozzle portion 110 for one unit time, and a purge gas may be simultaneously injected from the second gas nozzle portion 120 for the same unit time, that is, one unit time. Hereinafter, such an operation will be described in detail with reference to FIGS. 6 to 10.

FIGS. 6 to 10 are schematic views explaining the operation of an exemplary embodiment of an atomic layer deposition apparatus according to the invention.

Figure 6:
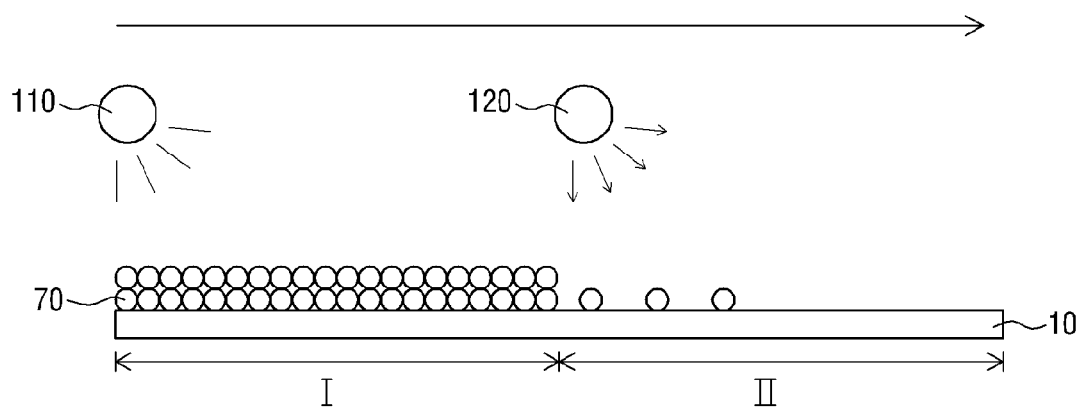
FIGS. 6 to 10 are schematic views explaining the operation of an exemplary embodiment of an atomic layer deposition apparatus according to the invention.

Referring to FIG. 6, the first reaction gas may be injected from the first gas nozzle portion 110 for one unit time, e.g., during a first unit time period, and the purge gas may be simultaneously injected from the second gas nozzle portion 120 for the same one unit time, e.g., the first unit time period.

For convenience of description, unit time periods that follow the first unit time period may be called a second unit time period, a third unit time period and an n-th unit time period. Here, the duration of each unit time period is one unit time. Further, an atomic layer forming process will be described through schematic illustration of atomic particles.

For convenience of illustration and description, a particle of an atomic layer that is formed on the substrate 10 by the first reaction gas is called a first unit particle 70, and a particle of an atomic layer that is formed on the substrate 10 by the second reaction gas is called a second unit particle 80, as shown in FIGS. 6 to 10.

In an exemplary embodiment, during the first unit time period, the first reaction gas may be injected from the first gas nozzle portion 110, and the purge gas may be injected from the second gas nozzle portion 120. The first reaction gas may form an atomic layer (e.g., one or more atomic layers) on the first region I of the substrate 10. In such an embodiment, an atomic layer including a plurality of first unit particles 70 may be formed. Unit particles that come in direct contact with the substrate 10 among a plurality of first unit particles 70 may be strongly bonded to the substrate 10. In such an embodiment, the unit particles may be bonded to the substrate 10 through chemical bonding. Unit particles, which do not come in direct contact with the substrate 10, but come in contact with other unit particles, among a plurality of unit particles may be physically bonded to each other. Such a bonding between the unit particles may be relatively weaker than the bonding between the substrate 10 and the unit particles. In such an embodiment, the bonding between the substrate 100 and the unit particles may be stronger than the bonding between the unit particles.

When the first reaction gas is injected from the first gas nozzle portion 110, the atomic layer may be formed on the first region I of the substrate 10.

Figure 7:
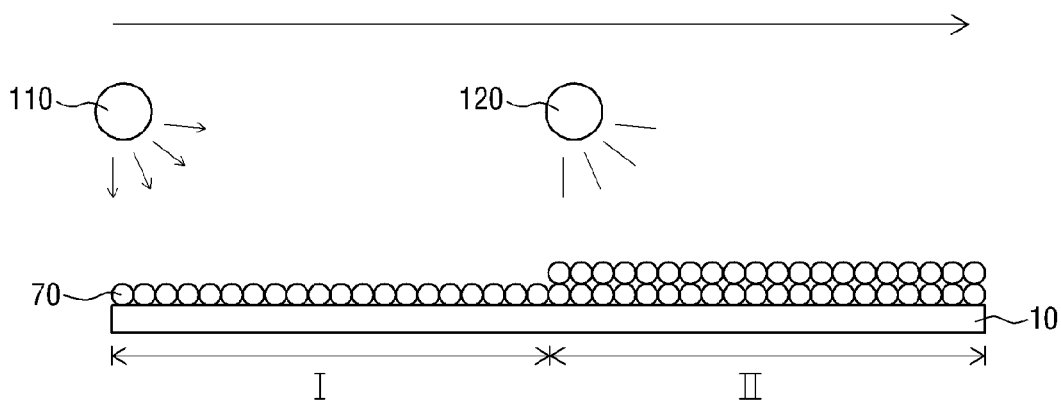

Referring to FIG. 7, after the atomic layer that is composed of the first unit particles 70 is formed on the first region I during the first unit time period, the forming of the atomic layer may be performed during the second unit time period.

During the second unit time period, the purge gas may be injected from the first gas nozzle portion 110 and the first reaction gas may be injected from the second gas nozzle portion 120.

When the purge gas is injected from the first gas nozzle portion 110, the unit particles that do not come in direct contact with the substrate 10 among the plurality of first unit particles 70 arranged on the first region I may be removed. As described above, the bonding force between the unit particles may be relatively weaker than the bonding force between the substrate 10 and the unit particles. By the purge gas that is injected from the first gas nozzle portion 110, the bonding between the unit particles may be interrupted, but the bonding between the substrate 10 and the unit particles may be maintained as it is. When the unit particles that do not come in direct contact with the substrate 10 among the first unit particles 70 are removed by the purge gas, a first single atomic layer, which is an atomic single layer of first unit particles 70, may be formed on the first region I.

At the same time during the second unit time period, the first reaction gas may be injected from the second gas nozzle portion 120.

The first reaction gas may form an atomic layer on the second region II of the substrate 10. In an exemplary embodiment, one or more atomic layers composed of a plurality of first unit particles 70 may be formed on the second region II of the substrate 10.

Figure 8:
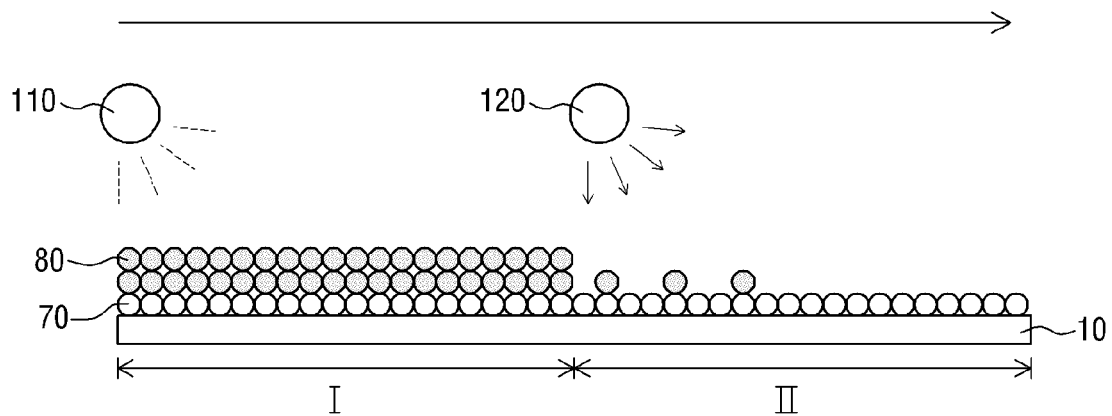

FIG. 8 shows a process during the third unit time period following the second unit time period. During the third unit time period, the second reaction gas may be injected from the first gas nozzle portion 110, and the purge gas may be discharged from the second gas nozzle portion 120.

When the second reaction gas is injected from the first gas nozzle portion 110, the atomic layer that is composed of a plurality of second unit particles 80 may be formed on the first region I of the substrate 10. The second unit particles 80 that come in direct contact with the first unit particles 70 among the plurality of second unit particles 80 may be relatively strongly bonded. That is, the bonding force between the first unit particles 70 and the second unit particles 80 may be relatively stronger than the bonding force between the second unit particles 80.

At the same time during the third unit time period, the purge gas may be injected from the second gas nozzle portion 120. The unit particles that do not come in direct contact with the substrate 10 among the plurality of first unit particles 70 arranged on the second region II may be removed. As described above, the bonding force between the unit particles may be relatively weaker than the bonding force between the substrate 10 and the unit particles. By the purge gas that is injected from the second gas nozzle portion 120, the bonding between the unit particles may be interrupted, but the bonding between the substrate 10 and the unit particles may be maintained as it is. When the unit particles that do not come in direct contact with the substrate 10 among the first unit particles 70 are removed by the purge gas, a first single atomic layer, which is an atomic single layer of first unit particles 70, may be formed on the second region II.

Figure 9:
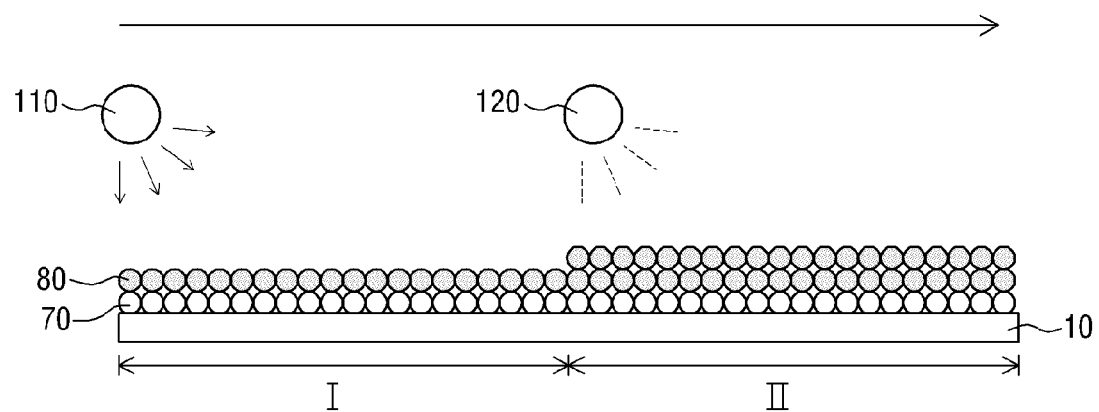

FIG. 9 shows a process during the fourth unit time period following the third unit time period.

During the fourth unit time period, the purge gas may be injected from the first gas nozzle portion 110 and the second reaction gas may be injected from the second gas nozzle portion 120.

When the purge gas is injected from the first gas nozzle portion 110, the unit particles that do not come in direct contact with the first unit particles 70 among a plurality of second unit particles 80 arranged on the first region I may be removed. As described above, the bonding force between the second unit particles 80 may be relatively weaker than the bonding force between the first unit particles 70 and the second unit particles 80. By the purge gas that is injected from the second gas nozzle portion 120, the bonding between the second unit particles 80 may be interrupted, but the bonding between the first unit particles 70 and the second unit particles 80 may be maintained as it is. When the second unit particles 80 that do not come in direct contact with the first unit particles 70 among the second unit particles 80 are removed by the purge gas, a second single atomic layer, which is an atomic single layer, may be formed on the first region I.

At the same time during the fourth unit time period, the second reaction gas may be injected from the second gas nozzle portion 120. The second reaction gas may form an atomic layer on the second region II of the substrate 10. In an exemplary embodiment, one or more atomic layers composed of a plurality of second unit particles 80 may be formed on the second region II of the substrate 10.

Figure 10:
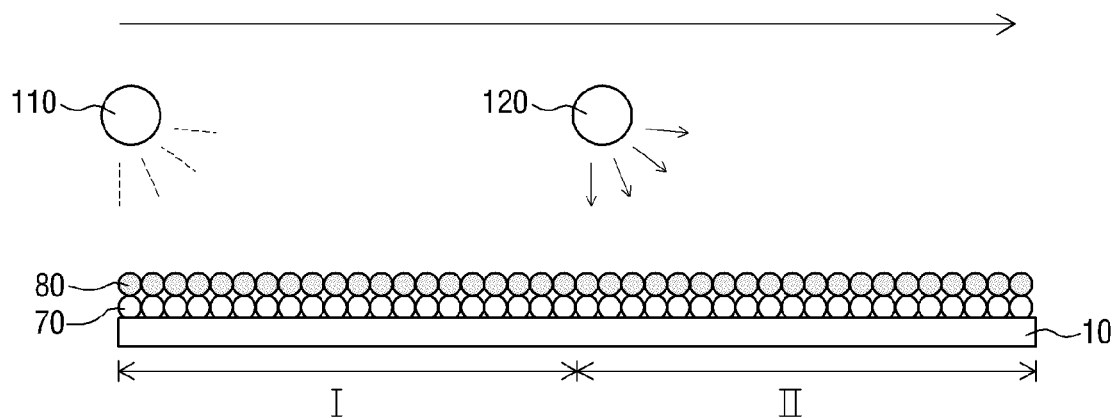

FIG. 10 shows a process during the fifth unit time period following the fourth unit time period. During the fifth unit time period, the purge gas may be injected from the second gas nozzle portion 120.

When the purge gas is injected from the second gas nozzle portion 120, the unit particles that do not come in direct contact with the first unit particles 70 among the plurality of second unit particles 80 arranged on the second region II may be removed. As described above, the bonding force between the second unit particles 80 may be relatively weaker than the bonding force between the first unit particles 70 and the second unit particles 80. By the purge gas that is injected from the second gas nozzle portion 120, the bonding between the second unit particles 80 may be interrupted, but the bonding between the first unit particles 70 and the second unit particles 80 may be maintained as it is. When the second unit particles 80 that do not come in direct contact with the first unit particles 70 among the second unit particles 80 are removed by the purge gas, a second single atomic layer, which is an atomic single layer, may be formed on the second region II. That is, an atomic layer, in which the first single atomic layer and the second single atomic layer are stacked, may be formed on the substrate 10.

Figure 11:
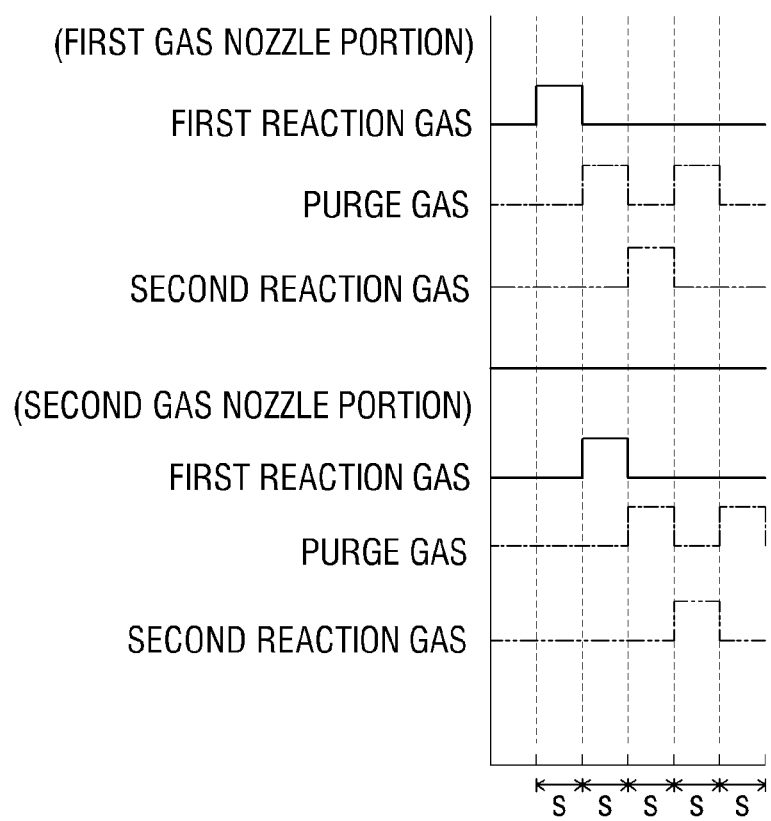
FIG. 11 is a graph explaining the operation of an exemplary embodiment of an atomic layer deposition apparatus according to the invention.

FIG. 11 is a graph explaining the operation of an exemplary embodiment of an atomic layer deposition apparatus according to the invention.

For convenience in explanation, one cycle is defined herein. One cycle may be defined as a time taken to form an atomic layer that includes a first single atomic layer and a second single atomic layer on the whole region of the substrate 10. Here, one cycle may be defined by a plurality of consecutive unit time periods.

FIG. 11 shows an exemplary embodiment where one cycle includes five unit time periods. However, this is exemplary, and one cycle is not limited thereto. The number of the unit time periods in one cycle may be variously determined based on various variables, such as an area of the substrate 10 or a gas injection amount, for example.

In an exemplary embodiment of the invention, a plurality of gas nozzle portions may simultaneously inject different gases during a predetermined unit time period, such that the time taken to form the atomic layer on the substrate 10 may be shortened. When the atomic layer on the whole region of the substrate 10 is formed using one gas nozzle portion, one cycle may include about 8 unit time periods based on the unit time periods illustrated in FIG. 11 (e.g., two unit time periods are required for each of first reaction gas injection, first purge gas injection, second reaction gas injection, and second purge gas injection). However, in the case of performing the same work using two gas nozzle portions, one cycle may be shortened down to five unit time periods.

Hereinafter, other exemplary embodiments of the invention will be described.

Figure 12:
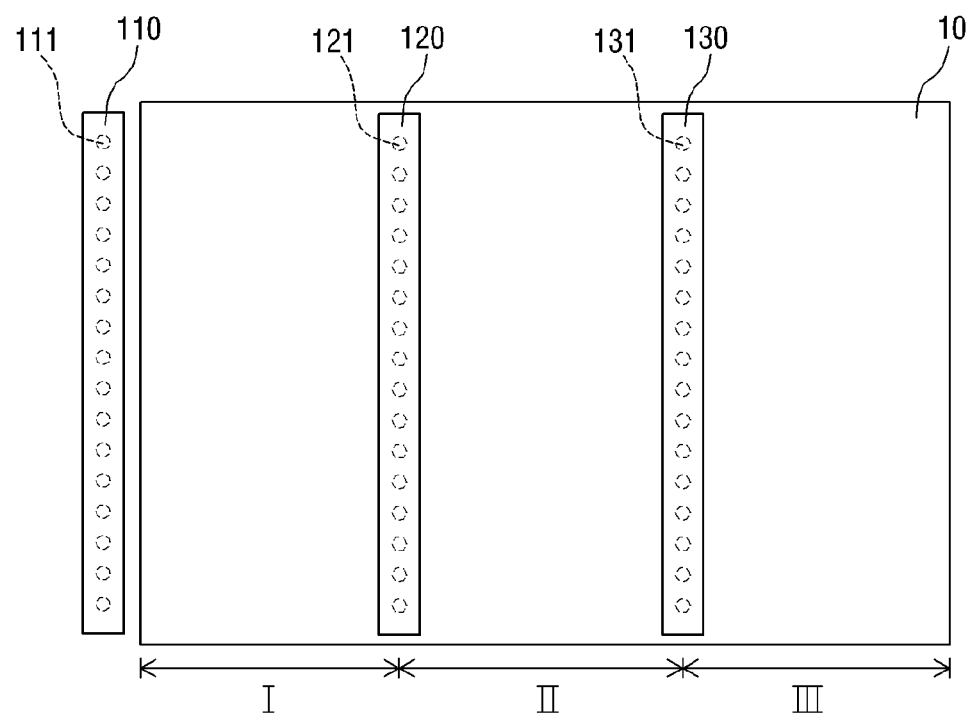
FIG. 12 is a partial plan view of an alternative exemplary embodiment of an atomic layer deposition apparatus according to the invention.

FIG. 12 is a partial plan view of alternative exemplary embodiment of an atomic layer deposition apparatus according to the invention.

An exemplary embodiment of an atomic layer deposition apparatus shown in FIG. 12 is substantially the same as the exemplary embodiment of the atomic layer deposition apparatus shown in FIG. 1 except for a third gas nozzle portion 130, which is arranged to be spaced apart from the second gas nozzle portion 120. The same or like elements shown in FIG. 12 have been labeled with the same reference characters as used above to describe the exemplary embodiments of the atomic layer deposition apparatus shown in FIG. 1, and any repetitive detailed description thereof will hereinafter be omitted or simplified.

In an exemplary embodiment, as shown in FIG. 12, the third gas nozzle portion 130 may be substantially the same as the first gas nozzle portion 110 or the second gas nozzle portion 120. In such an embodiment, the third gas nozzle portion 130 may be connected to the gas storage portion 300. In an exemplary embodiment, the third gas nozzle portion 130 may be connected to the first reaction gas storage portion 310, the purge gas storage portion 311, and the second reaction gas storage portion 312.

In an exemplary embodiment in which the atomic layer deposition apparatus further includes the third gas nozzle portion 130, a first region I to a third region III may be defined on the substrate 10.

In such an embodiment, as described above, the first gas nozzle portion 110 may be arranged on an upper portion of one side of the substrate 10. In such an embodiment, the second gas nozzle portion 120 may be arranged to be spaced apart from the first gas nozzle portion 110 with a predetermined distance, and the third gas nozzle portion 130 may be arranged to be spaced apart from the second gas nozzle portion 120 with a predetermined distance.

In an exemplary embodiment, the first region I may be defined as a region that is arranged between the first gas nozzle portion 110 and the second gas nozzle portion 120, the second region II may be defined as a region that is arranged between the second gas nozzle portion 120 and the third gas nozzle portion 130, and the third region III may be defined as a region that is arranged between the third gas nozzle portion 130 and the other side of the substrate 10.

In an exemplary embodiment, the first region I may be arranged adjacent to the other side of the first gas nozzle portion 110, the second region II may be arranged adjacent to the second gas nozzle portion 120, and the third region III may be arranged adjacent to the other side of the third nozzle portion 130. That is, each of the first to third regions may be any one of three equally divided regions of the substrate having the same area as each other.

Hereinafter, referring to FIGS. 13 to 18, the operation of an exemplary embodiment of an atomic layer deposition apparatus according to the invention will be described.

FIGS. 13 to 18 are schematic views explaining an alternative exemplary embodiment of the operation of an atomic layer deposition apparatus according to the invention.

For convenience in explanation, a unit time is defined. The unit time may be defined as a time taken for one gas nozzle portion to constantly inject one kind of gas. That is, for one unit time, one kind of gas may be constantly injected from one gas nozzle portion. Further, one unit time may be a time taken for one gas nozzle portion to form at least one atomic layer on a region that corresponds to one gas nozzle portion. That is, in an exemplary embodiment in which the first region I to the third region III are defined on the substrate 10 and the atomic layer deposition apparatus includes the first gas nozzle portion 110 to the third gas nozzle portion 130, one unit time may mean a time taken for the first gas nozzle portion 110 to form at least one atomic layer on the first region I.

Figure 13:
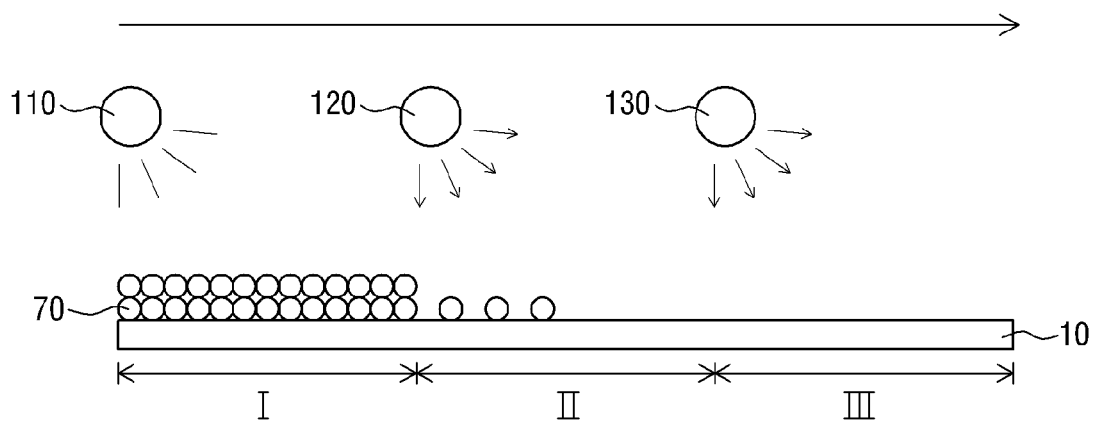
FIGS. 13 to 18 are schematic views explaining the operation of an alternative exemplary embodiment of an atomic layer deposition apparatus according to the invention.

Referring to FIG. 13, the first reaction gas may be injected from the first gas nozzle portion 110 for one unit time, e.g., a first unit time period.

For convenience in explanation, unit times that follow the first unit time may be called a second unit time period, a third unit time period, and an n-th unit time period. Here, the first to n-th unit time period may be sequentially arranged consecutive time periods, and three continuous unit time periods, may means any of three consecutive unit time periods among the first to n-th unit time periods, e.g., the first unit time period to the third unit time period, or the third unit time period to the fifth unit time period. Further, an atomic layer forming process will be described through schematic illustration of atomic particles.

For convenience in explanation, a particle of an atomic layer that is formed on the substrate 10 by the first reaction gas will be referred to as a first unit particle 70, and a particle of an atomic layer that is formed on the substrate 10 by the second reaction gas will be referred to as a second unit particle 80.

The first reaction gas may form an atomic layer (e.g., one or more atomic layer) on the first region I of the substrate 10 during the first unit time period. That is, an atomic layer that is composed of a plurality of first unit particles 70 may be formed.

Figure 14:
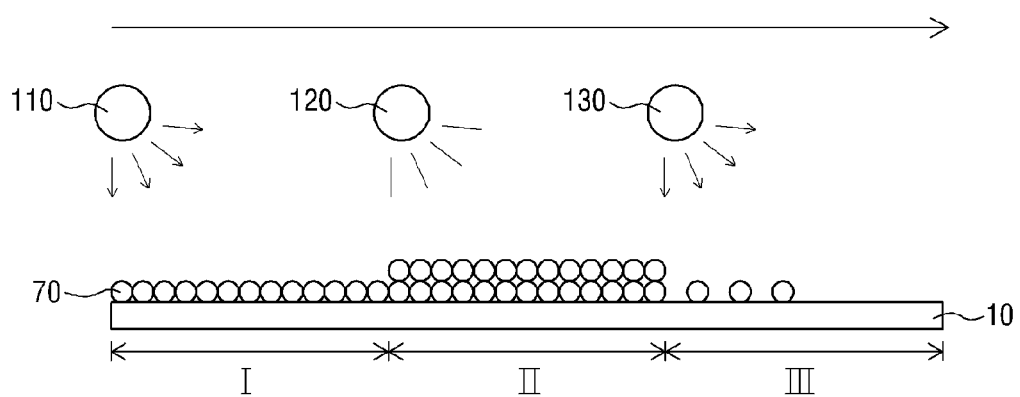

FIG. 14 shows a process during the second unit time period following the first unit time period.

During the second unit time period, the purge gas may be injected from the first gas nozzle portion 110 and the first reaction gas may be injected from the second gas nozzle portion 120.

When the purge gas is injected from the first gas nozzle portion 110, the unit particles that do not come in direct contact with the substrate 10 among the plurality of first unit particles 70 arranged on the first region I may be removed. As described above, the bonding force between the unit particles may be relatively weaker than the bonding force between the substrate 10 and the unit particles. By the purge gas that is injected from the first gas nozzle portion 110, the bonding between the unit particles may be interrupted, but the bonding between the substrate 10 and the unit particles may be maintained as it is. When the unit particles that do not come in direct contact with the substrate 10 among the first unit particles 70 are removed by the purge gas, a first single atomic layer, which is an atomic single layer composed of a plurality of first unit particles 70, may be formed on the first region I.

At the same time during the second unit time period, the first reaction gas may be injected from the second gas nozzle portion 120.

The first reaction gas may form an atomic layer on the second region II of the substrate 10 during the second unit time period. In such an embodiment, at least one atomic layer that is composed of a plurality of first unit particles 70 may be formed.

Figure 15:
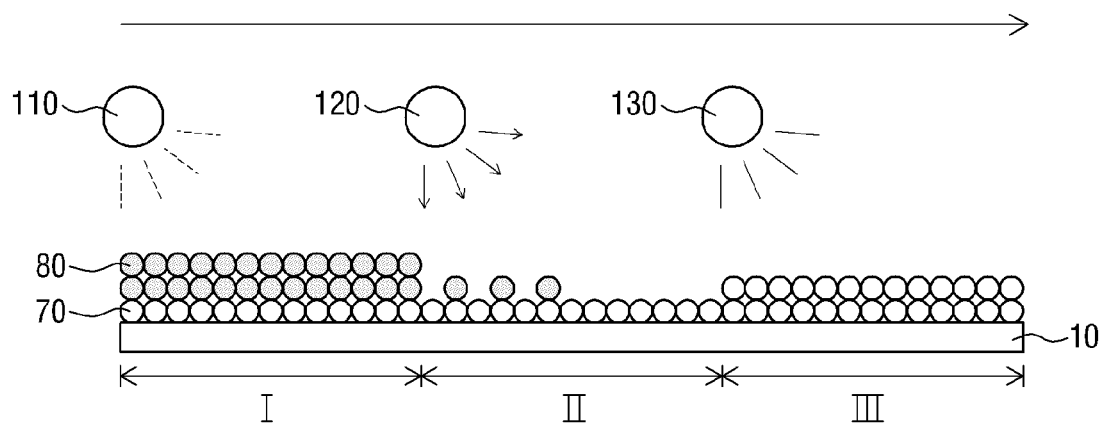

FIG. 15 shows a process during the third unit time period following the second unit time period.

During the third unit time period, the second reaction gas may be injected from the first gas nozzle portion 110, the purge gas may be discharged from the second gas nozzle portion 120, and the first reaction gas may be injected from the third gas nozzle portion 130.

When the second reaction gas is injected from the first gas nozzle portion 110, an atomic layer that is composed of a plurality of second unit particles 80 may be formed on the first region I of the substrate 10.

At the same time during the third unit time period, the purge gas may be injected from the second gas nozzle portion 120. The unit particles that do not come in direct contact with the substrate 10 among the plurality of first unit particles 70 arranged on the second region II may be removed. As described above, the bonding force between the unit particles may be relatively weaker than the bonding force between the substrate 10 and the unit particles. By the purge gas that is injected from the second gas nozzle portion 120, the bonding between the unit particles may be interrupted, but the bonding between the substrate 10 and the unit particles may be maintained as it is. When the unit particles that do not come in direct contact with the substrate 10 among the first unit particles 70 are removed by the purge gas, a first single atomic layer, which is an atomic single layer composed of the plurality of first unit particles 70, may be formed on the second region II.

At the same time during the third unit time period, the first reaction gas may be injected from the third gas nozzle portion 130 such that an atomic layer may be formed on the third region III of the substrate 10. In such an embodiment, at least one atomic layer that is composed of the plurality of first unit particles 70 may be formed on the third region III.

Figure 16:
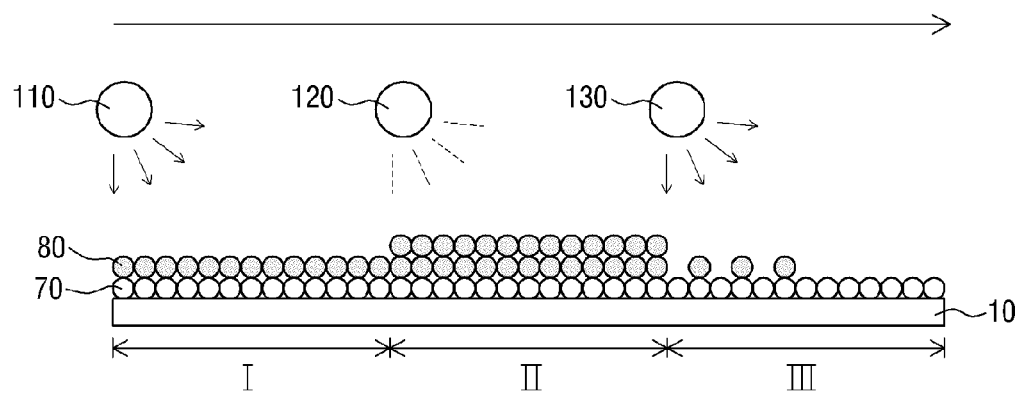

FIG. 16 shows a process during the fourth unit time period following the third unit time period.

During the fourth unit time period, the purge gas may be injected from the first gas nozzle portion 110, the second reaction gas may be injected from the second gas nozzle portion 120, and the purge gas may be injected from the third gas nozzle portion 130.

When the purge gas is injected from the first gas nozzle portion 110, the unit particles that do not come in direct contact with the first unit particles 70 among a plurality of second unit particles 80 arranged on the first region I may be removed. As described above, the bonding force between the second unit particles 80 may be relatively weaker than the bonding force between the first unit particles 70 and the second unit particles 80. By the purge gas that is injected from the second gas nozzle portion 120, the bonding between the second unit particles 80 may be interrupted, but the bonding between the first unit particles 70 and the second unit particles 80 may be maintained as it is. When the second unit particles 80 that do not come in direct contact with the first unit particles 70 among the second unit particles 80 are removed by the purge gas, a second single atomic layer, which is an atomic single layer, may be formed on the first region I. In such an embodiment, on the substrate 10, an atomic layer, in which a first single atomic layer and a second atomic layer are stacked, may be formed.

At the same time during the fourth unit time period, the second reaction gas may be injected from the second gas nozzle portion 120. When the second reaction gas is injected from the second gas nozzle portion 120, an atomic layer that is composed of the plurality of second unit particles 80 may be formed on the second region II of the substrate 10.

At the same time during the fourth unit time period, the purge gas may be injected from the third gas nozzle portion 130. When the purge gas is injected from the third gas nozzle portion 130, the unit particles that do not come in direct contact with the substrate 10 among the plurality of first unit particles 70 arranged on the third region III may be removed. As described above, the bonding force between the unit particles may be relatively weaker than the bonding force between the substrate 10 and the unit particles. By the purge gas that is injected from the third gas nozzle portion 130, the bonding between the unit particles may be interrupted, but the bonding between the substrate 10 and the unit particles may be maintained as it is. When the unit particles that do not come in direct contact with the substrate 10 among the first unit particles 70 are removed by the purge gas, a first single atomic layer, which is an atomic single layer composed of a plurality of first unit particles 70, may be formed on the third region III during the fourth unit time period.

Figure 17:
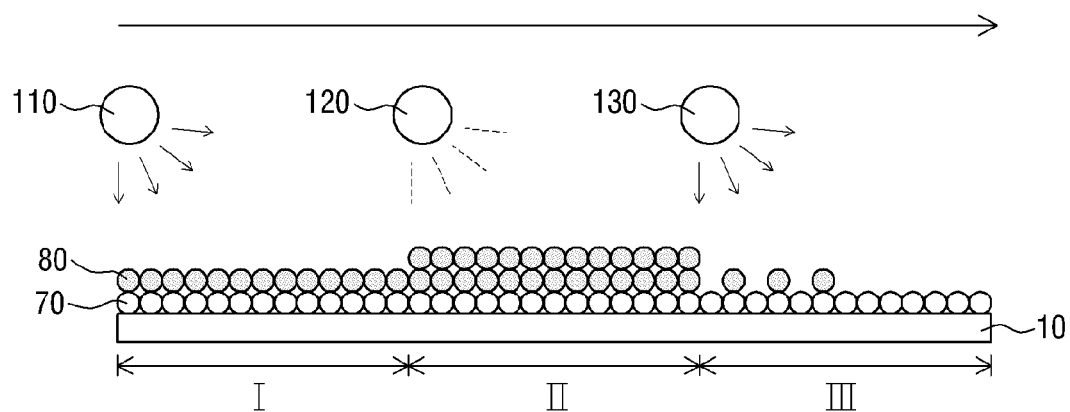

FIG. 17 shows a process during the fifth unit time period following the fourth unit time period.

During the fifth unit time period, the purge gas may be injected from the second gas nozzle portion 120, and the second reaction gas may be injected from the third gas nozzle portion 130.

When the purge gas is injected from the second gas nozzle portion 120, the unit particles that do not come in direct contact with the first unit particles 70 among the plurality of second unit particles 80 arranged on the second region II may be removed. As described above, the bonding force between the second unit particles 80 may be relatively weaker than the bonding force between the first unit particles 70 and the second unit particles 80. By the purge gas that is injected from the second gas nozzle portion 120, the bonding between the second unit particles 80 may be interrupted, but the bonding between the first unit particles 70 and the second unit particles 80 may be maintained as it is. When the second unit particles 80 that do not come in direct contact with the first unit particles 70 among the second unit particles 80 are removed by the purge gas, a second single atomic layer, which is one layer, may be formed on the second region II. In such an embodiment, an atomic layer, in which the first single atomic layer and the second single atomic layer are stacked, may be formed on the second region II of the substrate 10 during the fifth unit time period.

At the same time during the fifth unit time period, the second reaction gas may be injected from the third gas nozzle portion 130. When the second reaction gas is injected from the third gas nozzle portion 130, an atomic layer that is composed of the plurality of second unit particles 80 may be formed on the third region III of the substrate 10.

Figure 18:
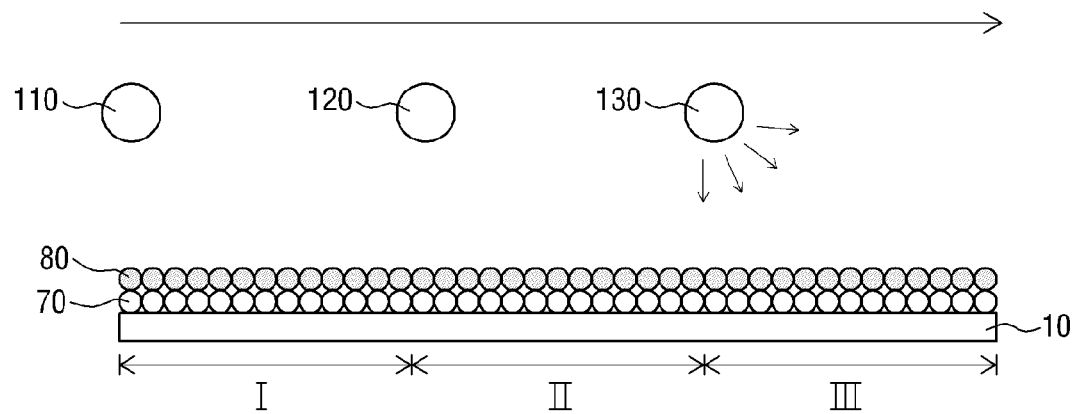

FIG. 18 shows a process during the sixth unit time period following the fifth unit time period.

During the sixth unit time period, the purge gas may be injected from the third gas nozzle portion 130.

When the purge gas is injected from the third gas nozzle portion 130, the unit particles that do not come in direct contact with the first unit particles 70 among the plurality of second unit particles 80 arranged on the third region III may be removed. As described above, the bonding force between the second unit particles 80 may be relatively weaker than the bonding force between the first unit particles 70 and the second unit particles 80. By the purge gas that is injected from the second gas nozzle portion 120, the bonding between the second unit particles 80 may be interrupted, but the bonding between the first unit particles 70 and the second unit particles 80 may be maintained as it is. When the second unit particles 80 that do not come in direct contact with the first unit particles 70 among the second unit particles 80 are removed by the purge gas, a second single atomic layer, which is one layer, may be formed on the third region III. In such an embodiment, an atomic layer, in which the first single atomic layer and the second single atomic layer are stacked, may be formed on the third region III of the substrate 10 during the sixth unit time period.

Figure 19:
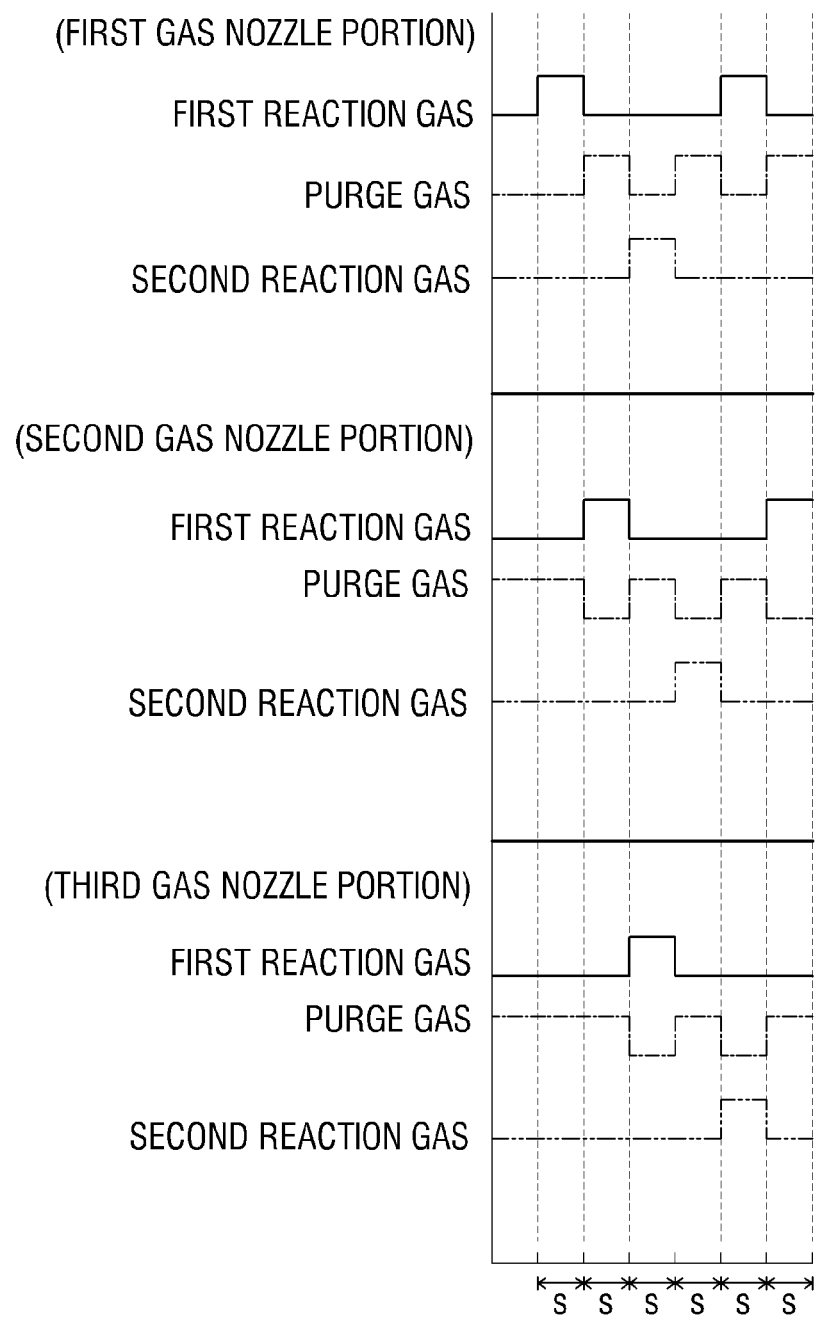
FIG. 19 is a graph explaining the operation of an alternative exemplary embodiment of an atomic layer deposition apparatus according to the invention.

FIG. 19 is a graph explaining the operation of an exemplary embodiment of an atomic layer deposition apparatus according to the invention.

As described above, for convenience in explanation, one cycle is defined. One cycle may be defined as a time taken to form an atomic layer that includes a first single atomic layer and a second single atomic layer on the whole region of the substrate 10. Further, one cycle may include a plurality of unit time periods. In such an embodiment of the atomic layer deposition apparatus shown in FIGS. 13 to 18, one cycle may include the first unit time periods to the sixth unit time periods, but the invention is not limited thereto.

As described above, in an exemplary embodiment, a plurality of gas nozzle portions inject different gases for the same unit time period, the time taken to form the atomic layer on the substrate 10 may be shortened. That is, when the atomic layer on the whole region of the substrate 10 is formed using one gas nozzle portion, one cycle may include about 12 unit time periods based on the unit time periods illustrated in FIG. 19 (three unit times are required for each of first reaction gas injection, first purge gas injection, second reaction gas injection, and second purge gas injection). However, in an exemplary embodiment where the same work is performed using three gas nozzle portions, one cycle may be shortened down to six unit time periods.

While the invention has been particularly shown and described with reference to exemplary embodiments thereof, it will be understood by those of ordinary skill in the art that various changes in form and details may be made therein without departing from the spirit and scope of the invention as defined by the following claims. It is therefore desired that the embodiments be considered in all respects as illustrative and not restrictive, reference being made to the appended claims rather than the foregoing description to indicate the scope of the invention.

What is claimed is:

1. An atomic layer deposition apparatus comprising:
a first base plate on which a seat portion is defined to allow a substrate to be seated thereon;
a second base plate disposed opposite to the first base plate;
a first gas nozzle portion arranged on the second base plate and extending in a first direction;
a second gas nozzle portion arranged on the second base plate to be spaced apart from the first gas nozzle portion and extending in a first direction; and
a plurality of injection holes disposed on the first gas nozzle portion and the second gas nozzle portion,
wherein the first base plate and the second base plate contact each other and form a space to which the first gas nozzle portion and the second gas nozzle connected,
wherein the plurality of injection holes are aligned in the first direction, and
wherein the space is opened in a second direction which is perpendicular to the first direction,
wherein
the first base plate comprises:
a first reference surface; and
a first recessed groove recessed from the first reference surface and having an open side,
the second base plate comprises:
a second reference surface; and
a second recessed groove recessed from the second reference surface and having an open side,
the first recessed groove and the second recessed groove define a reaction space having an opening when the first base plate and the second base plate are disposed to contact each other,
the seat portion is on the first base plate in the reaction space, and
the first gas nozzle portion and the second gas nozzle portion are arranged on the second base plate in the reaction space.

2. The atomic layer deposition apparatus of claim 1, further comprising:
a gas storage portion connected to the first gas nozzle portion and the second gas nozzle portion.

3. The atomic layer deposition apparatus of claim 2, wherein
the gas storage portion comprises:
a first reaction gas storage portion which stores a first reaction gas;
a purge gas storage portion which stores a purge gas; and
a second reaction gas storage portion which stores a second reaction gas,
each of the first gas nozzle portion and the second gas nozzle portion is connected to the first reaction gas storage portion, the purge gas storage portion, and the second reaction gas storage portion, and
each of the first gas nozzle portion and the second gas nozzle portion injects the first reaction gas, the second reaction gas or the purge gas.

4. The atomic layer deposition apparatus of claim 3, wherein
a first region arranged between the first gas nozzle portion and the second gas nozzle portion, and a second region arranged between the second gas nozzle portion and a side of the substrate on the seat portion are defined on the substrate on the seat portion, the first gas nozzle portion selectively injects the first reaction gas, the second reaction gas or the purge gas to the first region, and the second gas nozzle portion selectively injects the first reaction gas, the second reaction gas or the purge gas to the second region.

5. The atomic layer deposition apparatus of claim 3, wherein a unit time period is defined as a period during which each of the first gas nozzle portion and the second gas nozzle portion constantly injects a same kind of gas therefrom, and the first gas nozzle portion and the second gas nozzle portion inject different gases from each other during a same unit time period.

6. The atomic layer deposition apparatus of claim 5, wherein the unit time period comprises a first unit time period and a second unit time following the first unit time period, and the first gas nozzle portion injects the first reaction gas during the first unit time period, the first gas nozzle portion injects the purge gas during the second unit time, and the second gas nozzle portion injects the first reaction gas during the second unit time.

7. The atomic layer deposition apparatus of claim 5, further comprising:

a third gas nozzle portion arranged to be spaced apart from the second gas nozzle portion and substantially parallel to the second gas nozzle portion, and connected to the gas storage portion.

8. The atomic layer deposition apparatus of claim 7, wherein the unit time period comprises a first unit time period, a second unit time period, and a third unit time period, during the first unit time period, the first gas nozzle portion injects the second reaction gas, the second gas nozzle portion injects the purge gas, and the third gas nozzle portion injects the first reaction gas, during the second unit time period, the second gas nozzle portion injects the second reaction gas, and the third nozzle portion injects the purge gas, and during the third unit time period, the second gas nozzle portion injects the purge gas, and the third nozzle portion injects the second reaction gas.

9. An atomic layer deposition apparatus comprising:
a chamber;
a first base plate which is arranged inside the chamber and on which a seat portion is defined to allow a substrate to be seated thereon;
a second base plate disposed opposite to the first base plate;
a first gas nozzle portion arranged on the second base plate and extending in a first direction;
a second gas nozzle portion arranged on the second base plate to be spaced apart from the first gas nozzle portion and extending in a first direction;
a plurality of injection holes disposed on the first gas nozzle portion and the second gas nozzle portion; and
wherein the first base plate and the second base plate contact each other and form a space to which the first gas nozzle portion and the second gas nozzle connected, wherein the plurality of injection holes are aligned in the first direction, and wherein the space is opened in a second direction which is perpendicular to the first direction, wherein
the first base plate comprises:
a first reference surface; and
a first recessed groove recessed from the first reference surface and having an open side,
the second base plate comprises:
a second reference surface; and
a second recessed groove recessed from the second reference surface and having an open side,
the first recessed groove and the second recessed groove define a reaction space including an opening when the first base plate and the second base plate are disposed to contact each other,
the seat portion is on the first base plate in the reaction space, and
the first gas nozzle portion and the second gas nozzle portion are arranged on the second base plate in the reaction space.

10. The atomic layer deposition apparatus of claim 9, further comprising:
a vacuum forming portion which forms a vacuum state inside the chamber.

11. The atomic layer deposition apparatus of claim 9, further comprising:
a gas storage portion connected to the first gas nozzle portion and the second gas nozzle portion.

12. The atomic layer deposition apparatus of claim 11, wherein
the gas storage portion comprises:
a first reaction gas storage portion which stores a first reaction gas;
a purge gas storage portion which stores a purge gas; and
a second reaction gas storage portion which stores a second reaction gas,
each of the first gas nozzle portion and the second gas nozzle portion is connected to the first reaction gas storage portion, the purge gas storage portion and the second reaction gas storage portion, and
each of the first gas nozzle portion and the second gas nozzle portion injects the first reaction gas, the second reaction gas or the purge gas.

13. The atomic layer deposition apparatus of claim 12, wherein
a first region arranged between the first gas nozzle portion and the second gas nozzle portion and a second region arranged between the second gas nozzle portion and a side of the substrate on the seat portion are defined on the substrate on the seat portion,
the first gas nozzle portion selectively injects the first reaction gas, the second reaction gas or the purge gas to the first region, and
the second gas nozzle portion selectively injects the first reaction gas, the second reaction gas or the purge gas to the second region.

14. The atomic layer deposition apparatus of claim 12, wherein
a unit time period is defined as a period during which each of the first gas nozzle portion and the second gas nozzle portion constantly injects a same kind of gas therefrom, and
the first gas nozzle portion and the second gas nozzle portion inject different gases from each other during a same unit time period.

15. The atomic layer deposition apparatus of claim 14, wherein
- the unit time period comprises a first unit time period and a second unit time period following the first unit time period, and
- the first gas nozzle portion injects the first reaction gas during the first unit time period,
- the first gas nozzle portion injects the purge gas during the second unit time period, and
- the second gas nozzle portion injects the first reaction gas during the second unit time period.

16. The atomic layer deposition apparatus of claim 14, further comprising:
- a third gas nozzle portion arranged to be spaced apart from the second gas nozzle portion and substantially parallel to the second 8 gas nozzle portion, and connected to the gas storage portion.

17. The atomic layer deposition apparatus of claim 16, wherein
- the unit time period comprises a first unit time period, a second unit time period and a third unit time period,
- during the first unit time period, the first gas nozzle portion injects the second reaction gas, the second gas nozzle portion injects the purge gas, and the third gas nozzle portion injects the first reaction gas,
- during the second unit time period, the second gas nozzle portion injects the second reaction gas and the third nozzle portion injects the purge gas, and
- during the third unit time period, the second gas nozzle portion injects the purge gas, and the third nozzle portion injects the second reaction gas.

* * * * *